United States Patent
Lin et al.

(10) Patent No.: US 10,141,057 B1
(45) Date of Patent: Nov. 27, 2018

(54) ERASING METHOD OF SINGLE-GATE NON-VOLATILE MEMORY

(71) Applicant: YIELD MICROELECTRONICS CORP., Chu-Pei (TW)

(72) Inventors: Hsin-Chang Lin, Chu-Pei (TW); Wen-Chien Huang, Chu-Pei (TW); Wei-Tung Lo, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 0 days.

(21) Appl. No.: 15/818,948

(22) Filed: Nov. 21, 2017

(51) Int. Cl.
  *G11C 16/06* (2006.01)
  *G11C 16/04* (2006.01)
  *H01L 27/11521* (2017.01)

(52) U.S. Cl.
  CPC .... *G11C 16/0416* (2013.01); *H01L 27/11521* (2013.01)

(58) Field of Classification Search
  CPC .................................................. G11C 16/0416
  USPC ....................................................... 368/185.29
  See application file for complete search history.

(56) References Cited

U.S. PATENT DOCUMENTS

2005/0270850 A1* 12/2005 Wang .................. G11C 16/0416
  365/185.28
2008/0035973 A1* 2/2008 Lin ........................ H01L 27/115
  257/298

\* cited by examiner

*Primary Examiner* — Hoai V Ho
(74) *Attorney, Agent, or Firm* — Rosenberg, Klein & Lee

(57) ABSTRACT

An erasing method of a single-gate non-volatile memory is provided. The single-gate non-volatile memory has a single floating gate. The erasing method includes applying a voltage to the drain without applying to the gate to create and control an inversion layer. Therefore the required erasing voltage is reduced and the erasing speed is improved to avoid the over-erase problem.

3 Claims, 5 Drawing Sheets

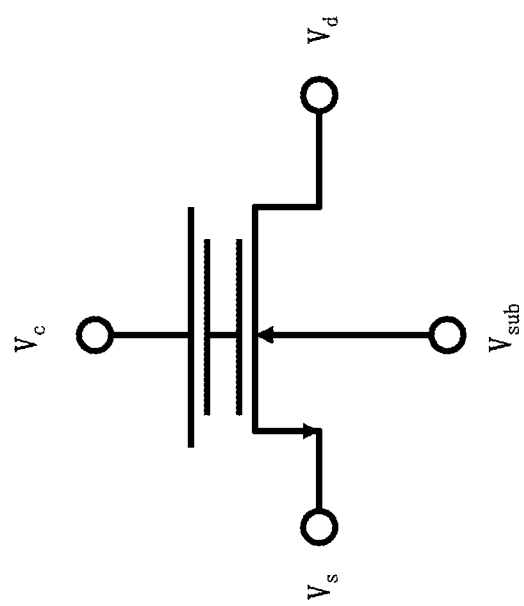

ERASING METHOD OF SINGLE-GATE NON-VOLATILE MEMORY

BACKGROUND OF THE INVENTION

Field of the Invention

The present invention relates to a non-volatile memory, particularly to an erasing method of a single-gate non-volatile memory wherein the memory with an oxide thickness greater than 100 angstroms (Å) by high-voltage processes to be erased.

Description of the Related Art

The CMOS (Complementary Metal Oxide Semiconductor) process has been a normal fabrication method for ASIC (Application Specific Integrated Circuit). EEPROM (Electrically Erasable Programmable Read Only Memory), which features electric programmability and erasability and would not lose its memory after power is turned off, has been one of the popular non-volatile memories in the computer and information age; therefore, EEPROM has been extensively used in electronic products.

A non-volatile memory is programmed via keeping charges to vary the gate voltage of the transistor thereof, or not keeping charges to preserve the gate voltage of the transistor. For a non-volatile memory, an erase operation is to eliminate all the charges kept in the non-volatile memory and restore all the transistors to have the original gate voltages. Therefore, in the structure of the conventional single-gate non-volatile memory, in addition to the gate layer of the transistor, a conductive layer is additionally added for storing charges to form a double-layer structure. Further, the conventional non-volatile memories are fabricated with the process including the more steps of the film deposition, etching, exposure and development than the conventional CMOS processes. This leads to increased cost, complicated manufacturing process, lower device yield, and improved man-hours, especially when used in embedded EEPROM products.

In conventional methods of erasing the EEPROM devices, the stored charge is transferred from the floating gate under the tunneling effect of Fowler-Nordheim tunneling (F-N tunneling). The voltage is usually greater than 10V. Since the structure of the single-gate EEMPROM memory has a transistor substrate-floating gate-capacitor substrate structure, the stored charge can be released to any direction according to the direction of electric field is applied; thus, the over-erase problem of the single-gate EEPROM device becomes more serious.

SUMMARY OF THE INVENTION

The primary objective of the present invention is to provide an erasing method of a single-gate non-volatile memory to overcome the abovementioned problems, wherein a single-floating-gate structure is utilized and the single-gate non-volatile memory with an oxide thickness greater than 100 angstroms (Å) by high-voltage processes can be erased. During erasing the memory, a voltage is applied to the drain without applying to the gate. Therefore, an inversion layer is created and controlled by the drain voltage to improve the erasing efficiency. When the erasing is completed, the erase operation is stopped by the drain voltage is reduced or the source voltage is increased. Thereby the over-erasing is prevented to solve the lack of the prior arts.

To achieved the abovementioned objective, the present invention discloses an erasing method of a single-gate non-volatile memory, which comprises a P-type semiconductor substrate, a transistor and a capacitor structure, wherein the transistor and the capacitor structure are embedded in the P-type semiconductor substrate; the transistor comprises a first dielectric layer disposed in the semiconductor substrate; a first electrically-conductive gate stacked on the surface of the first dielectric layer; and two first ion-doped regions separately disposed at both sides of the first electrically-conductive gate and the first dielectric layer, and respectively functioning as the source and the drain; similar to the transistor, the capacitor structure has a sandwich-like structure, and comprises a second dielectric layer, a second electrically-conductive gate, and a second ion-doped region; the first electrically-conductive gate of the transistor and the second electrically-conductive gate of the capacitor structure are mechanically separated but electrically connected, jointly functioning as a single floating gate of the non-volatile memory. The memory is erased via that a voltage is applied to the drain rather than to the gate to create and control an inversion layer by the drain voltage. Hence, the required erasing voltage is reduced and the erasing speed is increased.

In the present invention, the first ion-doped region and the second ion-doped region are N-type doped regions, and the capacitance structure may be N-type capacitance or N-well capacitance. Any operation of erasing a single-gate non-volatile memory with a different structure by the method of the present invention is included within the scope of the present invention.

Specifically, the erasing method of a single-gate non-volatile memory disclosed in the present invention can to perform an erasing process for a non-volatile memory formed of a P-type semiconductor substrate, a transistor and a capacitor structure. The erasing method respectively applies a substrate voltage, a source voltage and a drain voltage to the P-type semiconductor substrate, the source and the drain, but not applies any voltage to the gate. Besides, the drain voltage is greater than the source voltage, the source voltage is greater than or equal to the substrate voltage, and the substrate voltage is grounded.

To enable the objectives, technical contents, characteristics, and accomplishments of the present invention to be more easily understood, the embodiments of the present invention are to be described in detail in cooperation with the attached drawings below.

BRIEF DESCRIPTION OF THE DRAWINGS

FIG. 2C is a diagram schematically showing an equivalent circuit of the structure shown in FIG. 2A and FIG. 2B.

DETAILED DESCRIPTION OF THE INVENTION

Figure 1A:
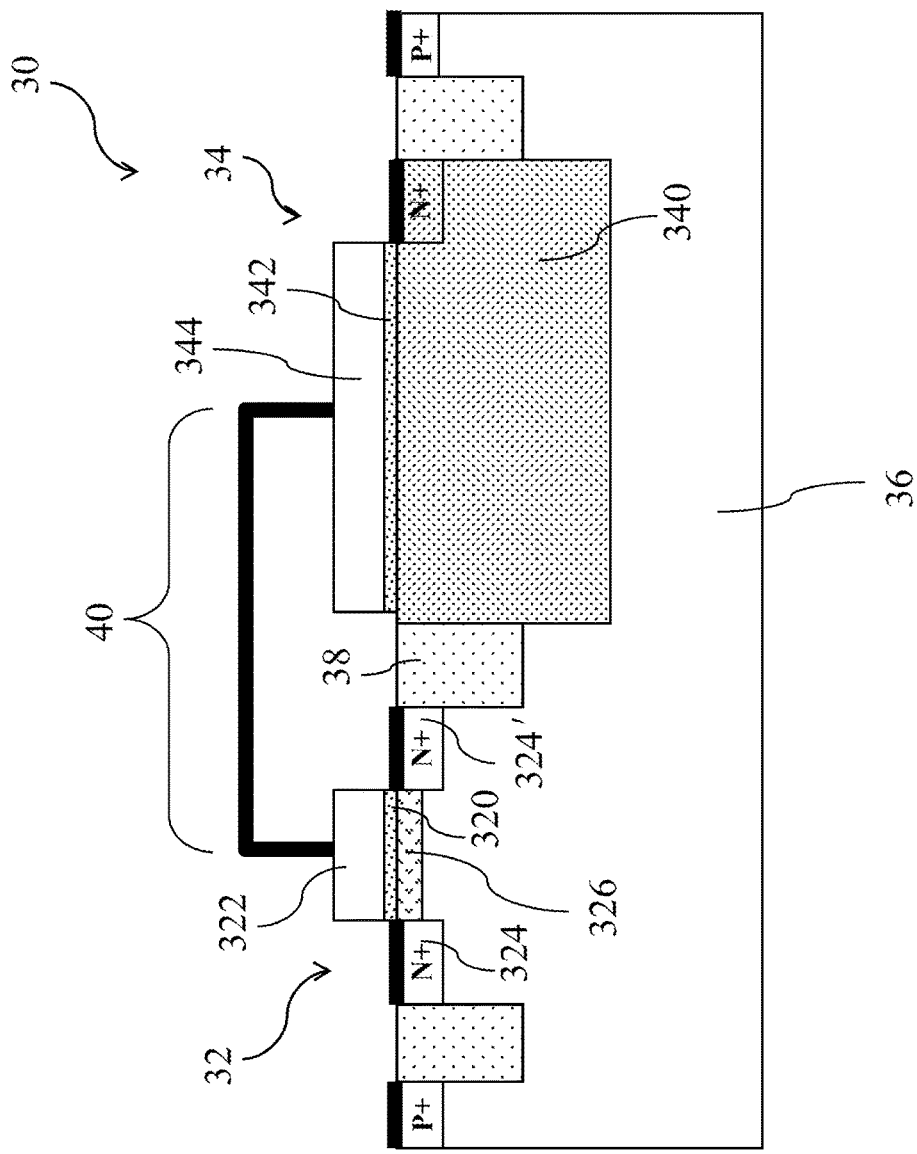
FIG. 1A is a sectional view schematically showing the structure of the single-gate non-volatile memory according to a first embodiment of the present invention.

Refer to FIG. 1A a sectional view schematically showing the structure of the single-gate non-volatile memory according to a first embodiment of the present invention. The single-gate non-volatile memory structure 30 comprises an NMOS transistor (NMOSFET) 32 and an N-well capacitor structure 34 with both of them embedded in a P-type semiconductor substrate 36, such as a silicon substrate. The NMOS transistor 32 includes a first dielectric layer 320 disposed on the surface of the P-type semiconductor substrate 36; a first electrically-conductive gate 322 stacked on the first dielectric layer 320; and two high-conductivity first ion-doped regions disposed inside the P-type semiconductor substrate 36, and respectively functioning as the source 324 and the drain 324' with a channel 326 formed between the source 324 and the drain 324'. The N-well capacitor structure 34 includes a second ion-doped region disposed in the P-type semiconductor substrate 36 and functioning as an N-type well 340; a second dielectric layer 342 disposed on the surface of the N-type well 340; and a second electrically-conductive gate 344 stacked on the second dielectric layer 342; those abovementioned elements form a top layer-dielectric layer-bottom layer capacitor structure. The first electrically-conductive gate 322 of the NMOS transistor 32 and the second electrically-conductive gate 344 on the top of the N-well capacitor structure 34 are separated with an isolation material 38 and electrically interconnected to form a single floating gate 40.

Figure 2A:
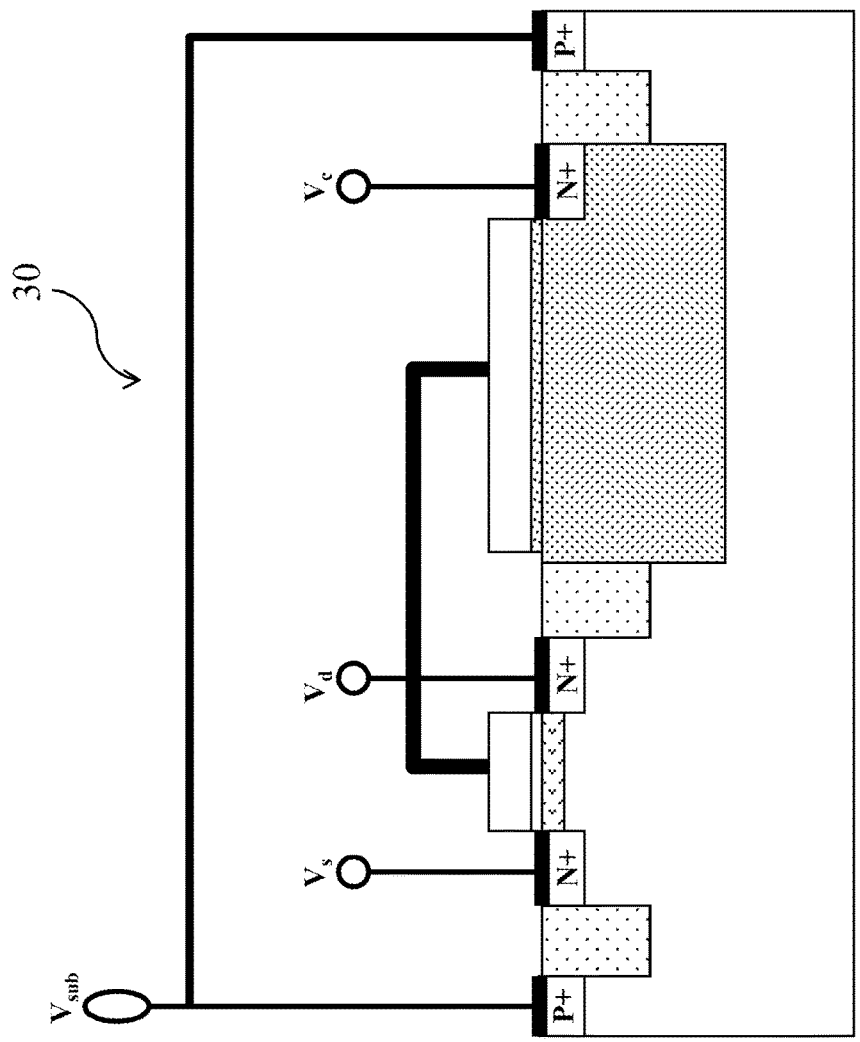
FIG. 2A is a diagram schematically showing the four-terminal structure of the first embodiment.

Refer to FIG. 2A. The single-gate non-volatile memory structure 30 has four terminals, including the connecting structures of the substrate, the source, the drain, and the control gate; a substrate voltage $V_{sub}$, a source voltage $V_s$, a drain voltage $V_d$, a control gate voltage $V_c$ are respectively applied to the substrate, the source, the drain, and the first ion-doped region. Refer to FIG. 2C for the equivalent circuit thereof. The conditions of the erasing operation process of the single-gate non-volatile memory structure 30 are:
a. $V_{sub}$ is grounded (=0), and
b. $V_s \geq V_{sub} = 0$, and $V_s < V_d$.
Therefore, $V_d > V_s \geq V_{sub} = 0$, and $V_c$ is not applied.

Figure 1B:
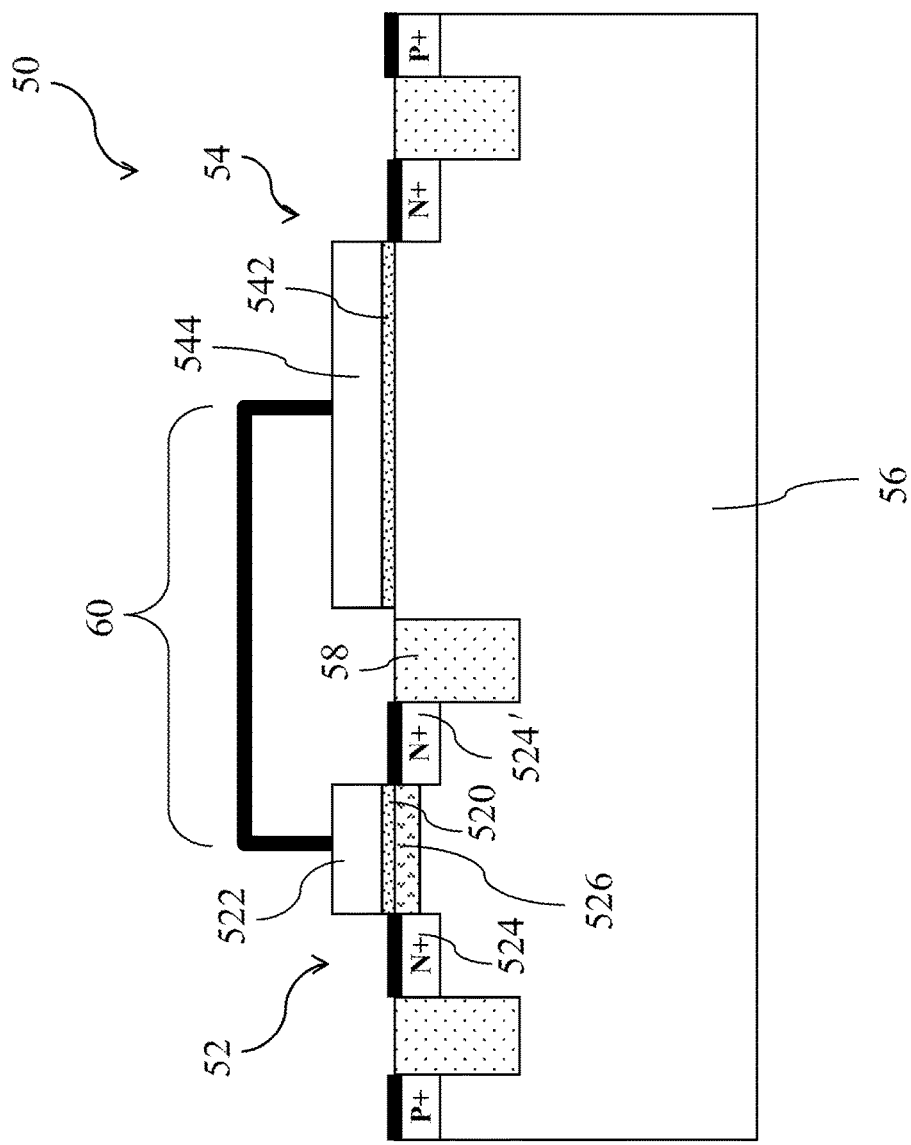
FIG. 1B is a sectional view schematically showing the structure of the single-gate non-volatile memory according to a second embodiment of the present invention

Refer to FIG. 1B a sectional view schematically showing the structure of the single-gate non-volatile memory according to a second embodiment of the present invention. The single-gate non-volatile memory structure 50 comprises a NMOS transistor 52 and an N-type capacitor structure 54 with both of them embedded in a P-type semiconductor substrate 56, such as a silicon substrate. The NMOS transistor 52 includes a first dielectric layer 520 disposed on the surface of the P-type semiconductor substrate 56; a first electrically-conductive gate 522 stacked on the first dielectric layer 520; and two high-conductivity first ion-doped regions disposed inside the P-type semiconductor substrate 56, and respectively functioning as the source 524 and the drain 524' with a channel 526 formed between the source 524 and the drain 524'. The N-type capacitor structure 54 includes a second ion-doped region disposed in the P-type semiconductor substrate 56; a second dielectric layer 542 disposed on the surface of the P-type semiconductor substrate 56; and a second electrically-conductive gate 544 stacked on the second dielectric layer 542; those abovementioned elements form a top layer-dielectric layer-bottom layer capacitor structure. The first electrically-conductive gate 522 of the NMOS transistor 52 and the second electrically-conductive gate 544 on the top of the N-type capacitor structure 54 are separated with an isolation material 58 and electrically interconnected to form a single floating gate 60.

Figure 2B:
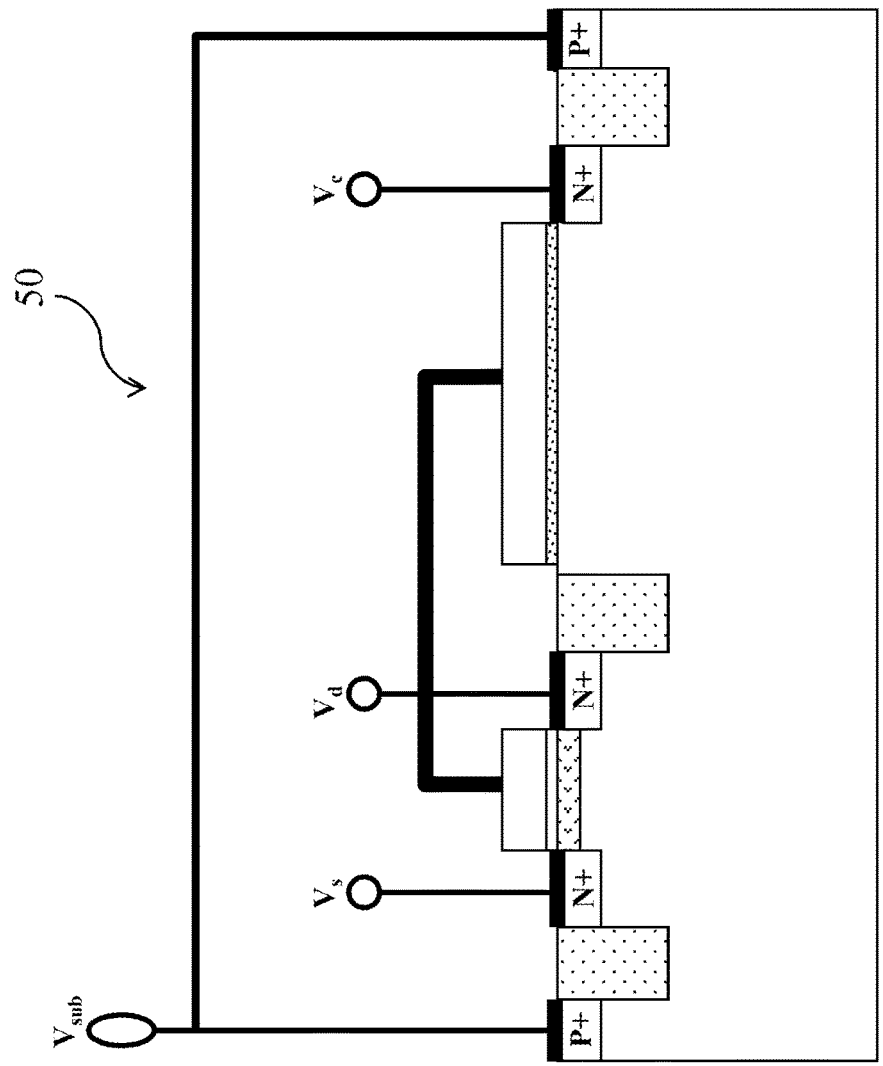
FIG. 2B is a diagram schematically showing the four-terminal structure of the second embodiment.

Refer to FIG. 2B. The single-gate non-volatile memory structure 50 has four terminals, including the connecting structures of the substrate, the source, the drain, and the control gate; a substrate voltage $V_{sub}$, a source voltage $V_s$, a drain voltage $V_d$, a control gate voltage $V_c$ are respectively applied to the substrate, the source, the drain, and the first ion-doped region. Refer to FIG. 2C for the equivalent circuit thereof. The conditions of the erasing operation process of the single-gate non-volatile memory structure 50 are:
a. $V_{sub}$ is grounded (=0), and
b. $V_s \geq V_{sub} = 0$, and $V_s < V_d$.
Therefore, $V_d > V_s \geq V_{sub} = 0$, and $V_c$ is not applied.

The single-gate non-volatile memory structure 30 shown in FIG. 1A is formed on a P-type silicon wafer. The isolation structure 38 is fabricated with a standard isolation module process. After the formation of the isolation structure 38, the channel 326 of the NMOS transistor 32 and the N-type well 340 are fabricated with ion-implant processes. After the dielectric layers of the first electrically-conductive gate 322 and the second electrically-conductive gate 344 have been grown, a polysilicon layer is formed via a deposition process. The polysilicon layer is patterned with a lithographic process and an etching process to form the single floating gate 40. Next, ion-implant processes are undertaken to form the source 324, the drain 324' of the NMOS transistor 32 and the control gate. Lastly, a metallization process is undertaken, and then, the fabrication of the single-gate non-volatile memory structure 30 is completed.

The fabrication process of single-gate non-volatile memory structure 50 shown in FIG. 1B is essentially similar to that described above. The single-gate non-volatile memory structure 50 is formed on a P-type silicon wafer. The isolation structure 58 is fabricated with a standard isolation module process. After the formation of the isolation structure 58, the channel 526 of the NMOS transistor 52 and the N-type capacitor structure 54 are fabricated with ion-implant processes. After the dielectric layers of the first electrically-conductive gate 522 and the second electrically-conductive gate 544 have been grown, a polysilicon layer is formed via a deposition process. The polysilicon layer is patterned with a lithographic process and an etching process to form the single floating gate 60. Next, ion-implant processes are undertaken to form the source 524, the drain 524' of the NMOS transistor 52 and the control gate. Lastly, a metallization process is undertaken, and then, the fabrication of the single-gate non-volatile memory structure 50 is completed.

In the present invention, the abovementioned processes usually refer to general CMOS processes.

In conclusion, the present invention provides an erasing method of the single-gate non-volatile memory. During erasing the memory, the voltage is applied to the drain of the single-gate non-volatile memory structure without applying to the gate for generating and controlling an anti-layer by the drain voltage, so that the required erasing voltage is reduced and the erasing speed is improved. When the erasing is completed, the drain voltage drops due to the channel opening or the source voltage rises to cause the erasing operation to stop, thereby reducing the erasing voltage and solving the over-erase problem.

Those embodiments described above are to clarify the present invention to enable the persons skilled in the art to understand, make and use the present invention; however, it is not intended to limit the scope of the present invention, and any equivalent modification and variation according to the spirit of the present is to be also included within the scope of the claims stated below.

What is claimed is:

1. An erasing method of a single-gate non-volatile memory, wherein said single-gate non-volatile memory comprises a P-type semiconductor substrate, a transistor and a capacitor structure, wherein said transistor and said capacitor structure disposed in said semiconductor substrate, and wherein said transistor includes a first electrically-conductive gate and multiple first ion-doped regions that are separately disposed at both sides of said first electrically-conductive gate and respectively function as the source and the drain, and wherein said capacitor structure includes a second electrically-conductive gate and a second ion-doped region, wherein said first electrically-conductive gate and said second electrically-conductive gate electrically interconnected to form a single floating gate, and wherein said erasing method is characterized in:

respectively applying a substrate voltage $V_{sub}$, a source voltage $V_s$ and a drain voltage $V_d$ to said P-type semiconductor substrate, said source and said drain, and not applying a voltage to said first ion-doped regions, wherein said voltages meet the following conditions:

$V_d > V_s \geq V_{sub}$, and $V_{sub}$ is grounded.

2. The erasing method of a single-gate non-volatile memory according to claim 1, wherein said first ion-doped regions and said second ion-doped region are N-type ion-doped regions, and said capacitor structure is N-type capacitor or N-well capacitor.

3. The erasing method of a single-gate non-volatile memory according to claim 1, wherein said transistor structure is a metal-oxide-semiconductor field-effect transistor (MOSFET).

* * * * *